(12) United States Patent
Liss et al.

(10) Patent No.: US 9,030,255 B2
(45) Date of Patent: May 12, 2015

(54) LINEARIZATION CIRCUIT AND RELATED TECHNIQUES

(71) Applicant: Auriga Measurement Systems, LLC, Chelmsford, MA (US)

(72) Inventors: Cheryl V. Liss, Merrimack, NH (US); Yusuke Tajima, Acton, MA (US); Qin Shen-Schultz, Oxford, MA (US); John Muir, North Chelmsford, MA (US)

(73) Assignee: Auriga Measurement Systems, LLC, Chelmsford, MA (US)

( * ) Notice: Subject to any disclaimer, the term of this patent is extended or adjusted under 35 U.S.C. 154(b) by 114 days.

(21) Appl. No.: 13/788,407

(22) Filed: Mar. 7, 2013

(65) Prior Publication Data

US 2013/0241655 A1    Sep. 19, 2013

Related U.S. Application Data

(60) Provisional application No. 61/612,473, filed on Mar. 19, 2012, provisional application No. 61/662,512, filed on Jun. 21, 2012.

(51) Int. Cl.
*H03F 3/68* (2006.01)
*H03G 3/00* (2006.01)
*H03F 1/02* (2006.01)
*H03F 1/32* (2006.01)

(52) U.S. Cl.
CPC .. *H03G 3/00* (2013.01); *H03F 3/68* (2013.01); *H03F 1/0288* (2013.01); *H03F 1/3247* (2013.01); *H03F 2201/3221* (2013.01)

(58) Field of Classification Search
CPC .................................................. H03F 1/3247
USPC .............................. 330/84, 136, 124 R, 295
See application file for complete search history.

(56) References Cited

U.S. PATENT DOCUMENTS

| | | | |
|---|---|---|---|
| 3,383,618 A | | 5/1968 | Engelbrecht |
| 3,755,754 A | | 8/1973 | Putz |
| 4,465,980 A | | 8/1984 | Huang et al. |
| 5,126,687 A | * | 6/1992 | Onoda et al. ................. 330/149 |
| 5,606,286 A | | 2/1997 | Bains |
| 7,042,283 B2 | | 5/2006 | Suzuki et al. |
| 7,170,344 B2 | | 1/2007 | Suzuki et al. |
| 8,023,908 B2 | | 9/2011 | Kim |
| 8,102,940 B1 | * | 1/2012 | Katz et al. .................... 375/296 |
| 2003/0141933 A1 | | 7/2003 | Pengelly |
| 2003/0210096 A1 | | 11/2003 | Pengelly et al. |

(Continued)

OTHER PUBLICATIONS

Office Action dated Jul. 16, 2014 for U.S. Appl. No. 13/788,824, filed Mar. 7, 2013.

(Continued)

*Primary Examiner* — Robert Pascal
*Assistant Examiner* — Khiem Nguyen
(74) *Attorney, Agent, or Firm* — Daly, Crowley, Mofford & Durkee, LLP

(57) ABSTRACT

Circuits and techniques to linearize the operation of an RF power amplifier are described. A linearizer circuit may include a non-amplification signal path which includes a delay line and an amplification signal path which includes at least one amplifier stage. In some embodiments, the amplification signal path may include an odd number of amplification stages. The linearizer may be used to precondition an input signal of an RF power amplifier in a manner that improves the overall linearity of operation.

27 Claims, 12 Drawing Sheets

(56) References Cited

U.S. PATENT DOCUMENTS

| | | | |
|---|---|---|---|
| 2004/0150473 A1* | 8/2004 | Hollingsworth et al. | 330/124 R |
| 2004/0189380 A1 | 9/2004 | Myer et al. | |
| 2004/0189381 A1 | 9/2004 | Louis | |
| 2006/0017500 A1 | 1/2006 | Hellberg | |
| 2006/0103466 A1 | 5/2006 | Shah et al. | |
| 2010/0117726 A1 | 5/2010 | Okubo et al. | |

OTHER PUBLICATIONS

Aktas, et al.; "Co gamma radiation effects on DC, RF, and pulsed I-V characteristics of AlGaN/GaN HEMTs;" Science Direct; Solid-State Electronics 48; Jan. 2004; pp. 471-475.

Myung et. al.; "Peak-to-Average Power Ratio of Single Carrier FDMA Signals With Pulse Shaping;" The $17^{th}$ Annual IEEE Symposium on Persona, Indoor and Mobile Radio Communications (PIMRC'06); Sep. 11-14, 2006; 5 pages.

Application of Yusuke Tajima, et al. filed Mar. 7, 2013; U.S. Appl. No. 13/788,824.

Response to Office Action dated Jul. 16, 2014 as filed on Oct. 10, 2014 for U.S. Appl. No. 13/788,824.

Office Action dated Nov. 21, 2014 for U.S. Appl. No. 13/788,824; 12 pages.

* cited by examiner

| | Goal | QPSK | | 64QAM | |
|---|---|---|---|---|---|
| Linearizer | | w/o | w | w/o | w |
| ACPR | -40 dBc | -40 dBc | -40 dBc | -40 dBc | -40 dBc |
| Pout | 30 dBm | 27 dBm | 34 dBm | 24 dBm | 32 dBm |
| Pin | | 8 dBm | 21 dBm | 5 dBm | 19 dBm |
| Gain | 13 dB | 19 dB | 13 dB | 18 dB | 13 dB |
| PAE | 35% | 18% | 39% | 10% | 32% |

LINEARIZATION CIRCUIT AND RELATED TECHNIQUES

CROSS REFERENCE TO RELATED APPLICATION

The present application claims the benefit of U.S. Provisional Patent Application No. 61/612,473 filed on Mar. 19, 2012 and U.S. Provisional Patent Application No. 61/662,512 filed on Jun. 21, 2012, which are both hereby incorporated by reference herein in their entireties.

FIELD

The structures and techniques described herein relate to radio frequency (RF) circuits and more particularly to circuits and techniques to linearly amplify an RF signal.

BACKGROUND

As is known in the art, a radio frequency (RF) amplifying device (such as a power amplifier used in RF systems, for example) has a first amplifying region in which signals are linearly amplified (often referred to as the amplifier's "linear region") and a second amplifying region in which the amplifying devices exhibit non-linear characteristics (often referred to as the amplifier's "non-linear region" or "saturation region").

When operating in its non-linear region, the amplifying device causes distortion in the phase and amplitude of an output signal. For example, an amplifier operating in its non-linear region may generate inter-modulation products. Such distortion is not desirable in most applications as it can lead to a degradation in performance of a system which includes the amplifier.

Such distortion components may be reduced or even eliminated by operating the amplifier in its linear region. One problem with the approach of operating the amplifier in its linear region, is that the amplifier may have only a limited range of RF input signal power levels over which it provides linear amplification. Furthermore, amplifiers are much more efficient (e.g. in terms of power added efficiency) when they are operating at or near their non-linear region but less efficient when operating in their linear region. Thus, the approach of operating the amplifier in its linear region can be quite limiting and not appropriate for many RF applications.

Power amplifiers, for example, often operate near their saturation region where amplifiers work at the maximum efficiency and thus may exhibit strong non-linear characteristics. Thus, in order to maximize output power and efficiency, the gains and phases of power amplifier output signals are distorted.

Consequently, power amplifiers often utilize a linearization circuit (or more simply a "linearizer") for compensating non-linear characteristics of a power amplifier. So-called "feed-forward" linearizers and "pre-distortion" linearizers have been conventionally proposed.

In the case of a power amplifier using a feed-forward linearizer, signals are dividedly applied to a main path and a sub-path, and carrier signals (or a tone signal and its corresponding signals) on the main path are amplified to a predetermined level by a main amplifier as the power amplifier and then output.

Intermodulation signals of the main amplifier are selectively output by a 3 dB hybrid coupler and attenuated to a predetermined level by an attenuator. The 3 dB hybrid coupler offsets the attenuated signals and signals that are applied to the sub-path and delayed via a first delay loop, so that the intermodulation signals are synthesized.

The resulting signals that are synthesized by the 3 dB hybrid coupler are applied to an error amplifier so that errors of the synthesized signals are corrected and the corrected signals are amplified. Thereafter, the corrected and amplified signals are amplified on the main path and synthesized with signals, which are delayed by a predetermined time via a second delay loop, and output. In the synthesization process, intermodulation distortion (MD) signals are offset and output.

Meanwhile, in the case of a power amplifier using a pre-distortion linearizer, an applied carrier signal is pre-distorted beforehand by a predetermined pre-distorter. The pre-distorted signal is amplified to a predetermined level by a main amplifier and output. In other words, a pre-distorted signal is generated beforehand and offset by a pre-distorted signal portion of an applied signal, and the remaining portion of the applied signal is amplified and output. In general, the power amplifier using the pre-distortion linearizer can have a small and lightweight structure with a broad bandwidth and a wide operating range at low cost.

While the conventional techniques described above have been somewhat effective, they have utilized relatively complicated circuits and techniques and are relatively expensive to implement both in terms of dollar cost and manpower cost.

SUMMARY

In accordance with the concepts, systems, circuits, and techniques described herein, a radio frequency (RF) linearization circuit (or linearizer) for use with an RF amplifier includes a first non-amplification signal path which includes a delay line and a second amplifying signal path which includes an amplifier.

With this particular arrangement, an RF linearizer amplifier is provided that is capable of providing a relatively linear response characteristic over a relatively wide range of input power levels and a relatively wide range of RF frequencies. The amplifying signal path may include a transistor amplifier consisting of an odd number of gain stages. Since the transistor amplifier consists of an odd number of gain stages, the amplifier phase shifts RF signals relative to the input signal by 180 degrees plus a small amount of delay caused by the transistor and amplifier circuit. The delay line in the non-amplification signal path equalizes the delay in the amplification path caused by the transistor and amplifier circuit, but maintains the 180 degree phase shift between the first and second signal paths. Since the 180 degree phase shift is accomplished by the transistor, the 180 degree relation is maintained in a broad frequency band. When these signals from both paths are combined through a combiner, the signals are cancelled in a broad frequency band due to 180 degree phase difference.

The amount of cancellation depends on the gain of the amplifier path, which is determined by the amplifier gain, splitting/combining losses, and attenuation in the amplification path. The linearizer may be designed with the signal from the amplification path being equal to the signal from non-amplification path when the amplifier in the amplification path is exhibiting the largest gain at small signal. Under small signal conditions, maximum cancellation (and minimum gain) may be achieved in the linearizer. When the amplifier within the amplification path operates in saturation due to a higher input power level, the amplifier gain becomes small or none, resulting in the output signal of the amplification path being much smaller than the signal from the non-amplification path. In this situation, the linearizer may exhibit a minimum cancellation or maximum gain. As a result, the overall linearizer will demonstrate a controlled gain expansion with input signal, which compensates the typical gain saturation characteristics of power amplifiers, when this linearizer is used as a pre-distorter.

In accordance with one aspect of the concepts, systems, circuits, and techniques described herein, a linearizer circuit comprises: a divider circuit having an input and first and second outputs; a first radio frequency (RF) signal path having an input and an output, the input being coupled to the first output of the divider circuit, the first RF signal path comprising a delay line having a predetermined length; a second RF signal path having an input and an output, the input being coupled to the second output of the divider circuit, the second RF signal path comprising a transistor amplifier consisting of an odd number of gain stages; and a combiner circuit having a first input, a second input, and an output, the first input of the combiner circuit being coupled to the output of the first RF signal path and the second input of the combiner circuit being coupled to the output of the second RF signal path.

In one embodiment, the divider circuit is configured to create a nominal 90 degree phase difference between output signals at the first and second outputs thereof; and the combiner circuit is adapted to receive two substantially opposite phase signals at the first and second inputs thereof with an additional nominal 90 degree phase shift and combine the signals while cancelling the 90 degree phase shift.

In one embodiment, the second RF signal path further comprises a first variable attenuator coupled between the input of the second RF signal path and an input of the transistor amplifier; and a second variable attenuator coupled between an output of the transistor amplifier and the output of the second RF signal path.

In one embodiment, the linearizer circuit further comprises circuitry for adjusting a bias level applied to the transistor amplifier; and circuitry for adjusting an attenuation level of at least one of the first and second variable attenuators.

In one embodiment, the circuitry for adjusting an attenuation level comprises circuitry for adjusting the attenuation level in conjunction with a change in bias voltage level applied to the transistor amplifier.

In one embodiment, the circuitry for adjusting a bias level and the circuitry for adjusting an attenuation level are configured to adjust an output amplitude of the second RF signal path so that it is substantially equal to an output amplitude of the first RF signal path when an input power level of the linearizer circuit is below a threshold value.

In one embodiment, at least one of the first and second variable attenuators is provided as an electronically tunable attenuator controllable in conjunction with a change in bias voltage level applied to the transistor amplifier.

In one embodiment, at least one of the first and second RF signal paths includes a phase adjuster.

In one embodiment, the linearizer circuit further comprises circuitry to electronically adjust a phase shift of at least one of the first and second RF signal paths.

In one embodiment, the circuitry to electronically adjust the phase shift of at least one of the first and second RF signal paths is configured to achieve a phase difference between the output signals of the first and second RF signal paths that results in signal cancellation in the combiner circuit.

In one embodiment, the linearizer circuit further comprises circuitry for electronically adjusting an output amplitude level of at least one of the first and second RF signal paths; and circuitry for electronically adjusting a phase shift of at least one of the first and second RF signal paths.

In one embodiment, the output of the combiner is to be coupled to the input of an RF power amplifier during operation of the linearizer circuit; and the linearizer circuit further comprises a signal processing unit to determine an optimum condition based on an RF output signal of the RF power amplifier and to provide at least one control signal to the circuitry for electronically adjusting an output amplitude level and the circuitry for electronically adjusting a phase shift based on the optimum condition.

In one embodiment, the signal processing unit is configured to receive signals indicative of environmental conditions and to use the signals indicative of environmental conditions to determine the optimum condition.

In one embodiment, the linearizer circuit is configured to achieve a higher level of signal cancellation in the combiner when lower power input signals are applied to the linearizer and a lower level of signal cancellation in the combiner when higher power input signals are applied to the linearizer.

In accordance with another aspect of the concepts, systems, circuits, and techniques described herein, a method for use in linearizing operation of an RF power amplifier comprises: splitting a radio frequency (RF) input signal into first and second RF input signals; providing the first RF input signal to a first RF signal path; providing the second RF input signal to a second, different RF signal path, wherein the second RF signal path includes at least one active amplifier stage and the first RF signal path includes no active amplifier stages; providing a first RF output signal at an output of the first RF signal path to a first input of a combiner; providing a second RF output signal at an output of the second RF signal path to a second input of the combiner; combining the first and second RF output signals in the combiner to generate a combined RF output signal at an output of the combiner; and providing the combined RF output signal to the input of an RF power amplifier.

In one embodiment, providing the second RF input signal to the second RF signal path includes providing the second RF input signal to an RF signal path that includes a transistor amplifier having an odd number of active amplifier stages.

In one embodiment, providing the second RF input signal to the second RF signal path includes providing the second RF input signal to an RF signal path that includes a first variable attenuator positioned before the transistor amplifier and a second variable attenuator positioned after the transistor amplifier.

In one embodiment, the method further comprises adjusting at least one of a phase shift and an output amplitude level associated with the first and second RF signal paths in a manner that results in maximal cancellation of the first and second RF output signals in the combiner under small signal conditions.

In one embodiment, adjusting is performed under the control of a signal processing device.

In one embodiment, splitting the RF input signal into first and second RF input signals comprises splitting the RF input signal to provide first and second RF input signals with substantially 90 degrees of phase difference between them; and combining the first and second RF output signals comprises combining the signals in a combiner that takes two substantially opposite phase signals with an additional nominal 90 degrees of phase shift and combines them while cancelling the additional nominal 90 degrees of phase shift.

In one embodiment, the method further comprises: determining an optimum condition based on an RF output signal of the RF power amplifier; and electronically adjusting an attenuation level in at least one of the first RF signal path and the second RF signal path, using control signals, based, at least in part, on the optimum condition.

In one embodiment, the method further comprises electronically adjusting a phase shift in at least one of the first RF signal path and the second RF signal path, using control signals, based, at least in part, on the optimum condition.

In one embodiment, the optimum condition is a condition that minimizes sideband levels in the RF output signal of the RF power amplifier.

In accordance with a further aspect of the concepts, systems, circuits, and techniques described herein, an amplification system comprises: a linearizer circuit comprising: a divider circuit having an input and first and second outputs; a first radio frequency (RF) signal path having an input and an output, the input of the first RF signal path being coupled to the first output of the divider circuit; a second RF signal path having an input and an output, the input of the second RF signal path being coupled to the second output of the divider circuit; and a combiner circuit coupled to the outputs of the first and second RF signal paths to combine output signals of the first and second RF signal paths to generate an output signal of the linearizer circuit; and a power amplifier coupled to receive the output signal of the linearizer circuit; wherein the power amplifier with the linearizer circuit operates more linearly than the power amplifier operating alone.

In one embodiment, the first RF signal path includes a delay line having a predetermined length and the second RF signal path includes a transistor amplifier consisting of an odd number of gain stages.

In one embodiment, the second RF signal path includes at least one adjustable attenuator.

In one embodiment, the second RF signal path includes at least one adjustable phase shifter.

In one embodiment, the first RF signal path includes at least one adjustable phase shifter.

In one embodiment, the gain versus input power curve of the linearizer circuit substantially complements the gain versus input power curve of the power amplifier to generate relatively linear gain for the amplification system overall.

BRIEF DESCRIPTION OF THE DRAWINGS

The foregoing features may be more fully understood from the following description of the drawings in which.

DETAILED DESCRIPTION

Figure 1:
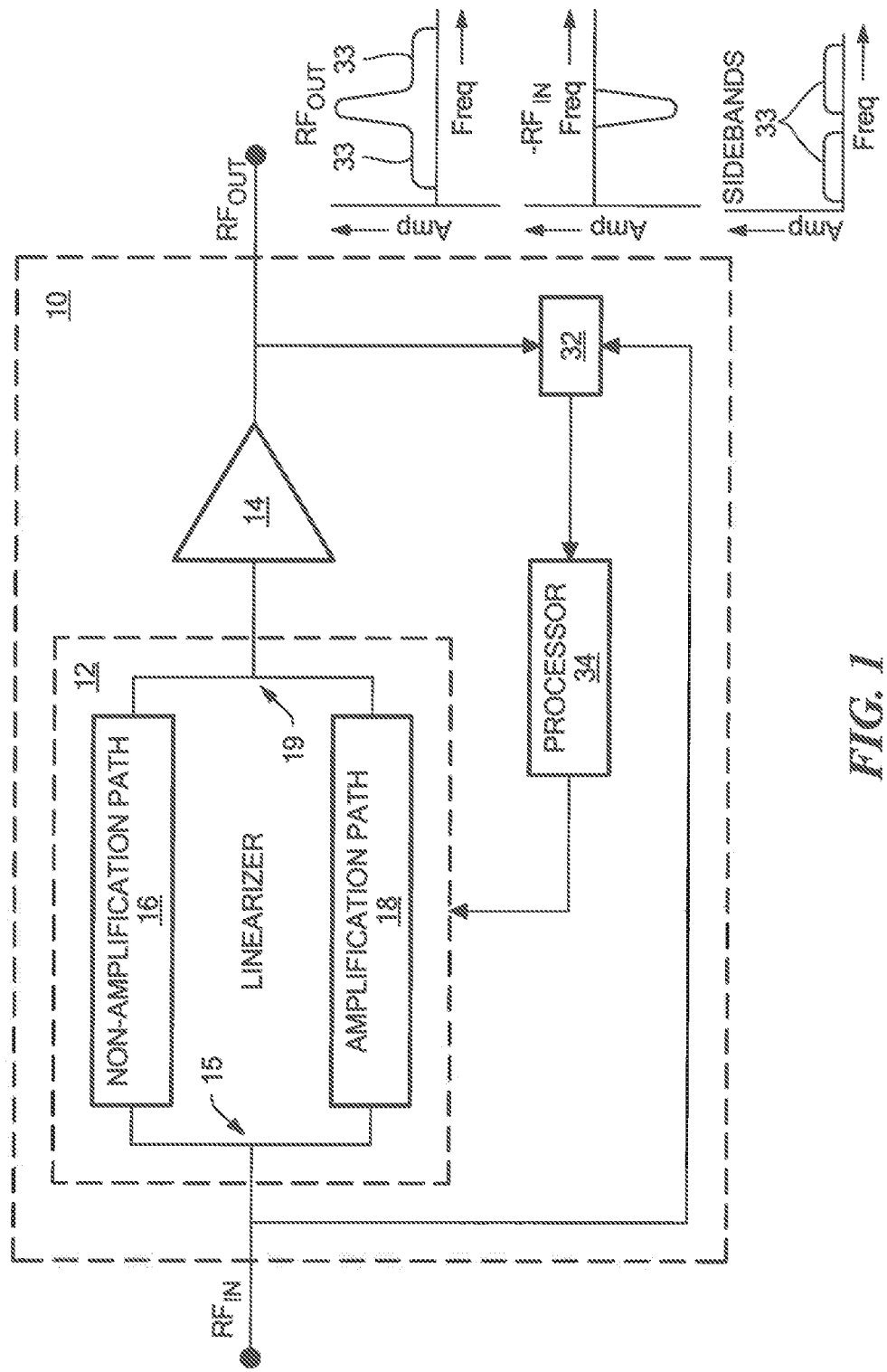
FIG. 1 is a block diagram of an exemplary linearized radio frequency (RF) amplifying device in accordance with an embodiment.

Referring now to FIG. 1, an amplifying device 10 for amplifying radio frequency (RF) signals provided to an input port thereof includes a linearization circuit (also referred to herein as a "linearizer circuit" or more simply a "linearizer") 12 having an input coupled to the input the RF amplifying device 10 and an output coupled to an input of an RF amplifier 14. RF amplifier 14 may, for example, be provided as a high gain RF amplifier or as a high power RF amplifier.

Linearizer circuit 12 includes a divider circuit 15 having an input coupled to the linearizer input and having a pair of outputs. Divider circuit 15 splits the RF input signal $RF_{IN}$ into first and second signal components to be applied to first and second RF signal paths 16, 18, respectively. Divider circuit 15 may be provide, for example, as an RF coupler (e.g., a 0 degree, 90 degree, or 180 degree coupler), an RF splitter (e.g., a Wilkinson type power divider, etc), or any other type of circuit for dividing signals into multiple components.

RF signal path 16 is a non-amplification (passive) signal path and RF signal path 18 is an amplification (active) signal path. Each of the signal paths 16, 18 has an output coupled to a respective input of combiner circuit 19. The combiner circuit 19 has an output coupled to the output of the linearizer circuit 12 and thus to the input of RF amplifier 14. Divider circuit 15 and combiner circuit 19 may each include either a symmetric device/system (e.g., a 3 dB hybrid, etc.) or an asymmetric device/system (e.g., a 10 dB coupler, etc.).

Amplifying device 10 further includes a combiner 32 which receives a portion of the RF input signal $RF_{IN}$ and a portion of the RF output signal $RF_{OUT}$, it should be appreciated that the RF input signal $RF_{IN}$ provided to combiner 32 is substantially "clean" (i.e., without sidebands), while the RF output signal $RF_{OUT}$ provided to combiner 32 includes sidebands 33 generated as a result of amplifier 14 being operated in or near its non-linear region.

Combiner 32 subtracts the clean RF input signal $RF_{IN}$ from the RF output signal $RF_{OUT}$ to isolate sidebands 33. The isolated sideband signals 33 are provided to a signal processing unit 34 (or more simply processor 34) that in some embodiments finds an optimum condition for attenuation and bias voltage settings and/or phase shifter settings of linearizes circuit 12. These conditions can be found by, for example, searching methods where the settings are varied to achieve the minimum sideband signal power.

As will be described in detail below in conjunction with FIG. 2, processor 34 may provide one or more control signals to the amplification path 18. The control signal(s) set the conditions needed in signal path 18 to reduce (or in an ideal case eliminate) sideband signals 33 from the RF output signal $RF_{OUT}$. In some implementations, processor 34 may also provide one or more control signals to elements within first RF signal path 16.

Figure 2:
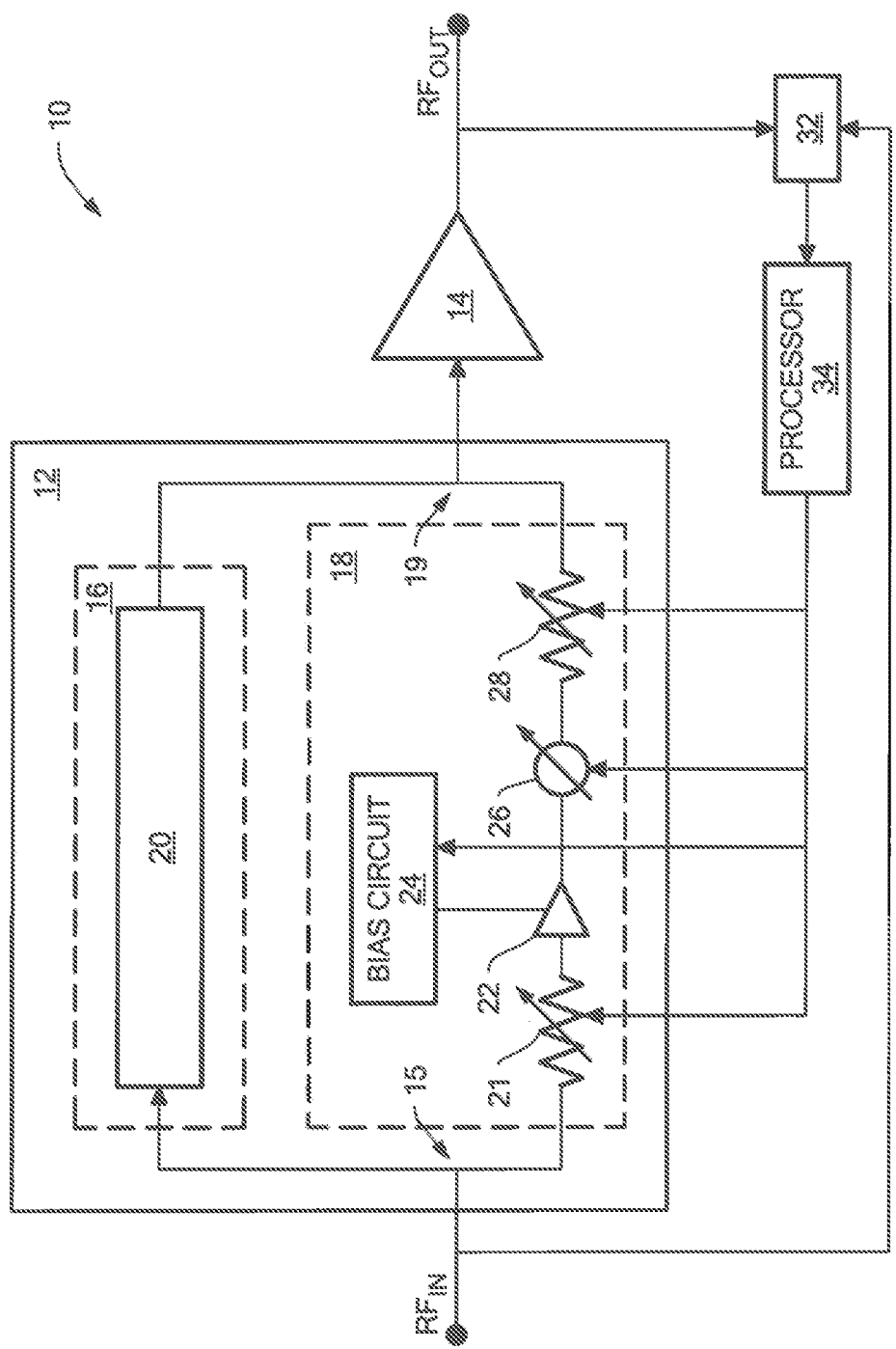
FIG. 2 is a block diagram of another exemplary linearized RF amplifying device in accordance with an embodiment.

Referring now to FIG. 2, non-amplification signal path 16 may include a delay line 20. In some embodiments, delay line 20 may be implemented as an RF transmission line (e.g., a microstrip transmission line, etc.) having a predetermined length. Non-amplification signal path 16 may also optionally include a phase adjustor (not shown in FIG. 2). It should be appreciated that the purpose of the delay line 20 is to set the delay in non-amplification signal path 16 based on the delay in amplification signal path 18.

It should also be appreciated that a delay line delays a signal fed thereto by a specified time delay. This implies that the phase shift of a delay line is a linear function of frequency. A microstrip transmission line is an approximation to a delay line since the phase shift of a microstrip line is not precisely a linear function of frequency (i.e., microstrip lines are dispersive). A delay line does not introduce an impedance transformation in the transmission path. It should thus be appreciated that there are many ways to implement delay lines over limited bandwidths such as with lumped element L-C networks for example as used herein, the phrase "delay line" will include transmission line structures that approximate a delay line.

It should further be appreciated that portions, or in some cases all, of the delay provided in non-amplification signal path 16 may be provided by other circuit components in path 16 (e.g., phase adjuster circuits, amplitude adjustment circuits such as attenuators, etc.). In such cases, the delay line is said to be "absorbed" or "integrated" into the other circuit component(s).

Amplification signal path 18 may include a transistor amplifier 22 consisting of an odd number of gain stages and a first variable attenuator 21 coupled between the input of the second RF signal path 18 and an input of transistor amplifier 22. Transistor amplifier 22 may have a bias circuit 24 coupled thereto. Amplification signal path 18 may further include a phase adjustor 26 and a second variable attenuator 28 coupled between an output of transistor amplifier 22 and the output of the second RF signal path 18.

It should be appreciated that phase shifters placed in one or both of the amplifying and non-amplifying signal paths may be used to fine-adjust the relative phases of signals that are combined at the combiner 19. Nominally, the signals may be set opposite (180 degrees) in phase to cancel when combined. Introducing a small offset in the relative phase shift will bring the phase cancellation angle to change with the degree of cancellation. As a result, a small offset from 180 degrees will introduce positive or negative AM/PM characteristics depending upon the direction of the offset. Adjustment of this offset by phase shifters in both paths may be used to match the AM/PM of the linearizer to that of the RF amplifier, which may be positive or negative.

By utilizing a transistor amplifier consisting of an odd number of gain stages, the amplifier provides an odd multiple of a 180 degree phase shift to RF signals plus a small amount of additional delay. Thus, the RF signals at the outputs of signal paths 16, 18 are 180 degrees out of phase, after the small delay is corrected by, for example, a delay line in one of the paths 16, 18.

In one embodiment, linearizer circuit 12 includes a divider circuit 15 which creates a nominal 90 degrees of phase shift between the two RF output signals, in such an embodiment, the combiner circuit 19 may receive two substantially opposite phase RF signals with an additional nominal 90 degrees of phase shift and combine the signals while cancelling the 90 degree phase shift, in some embodiments, a 90 degree phase shifter may be included in one of the paths 16, 18 to account for the 90 phase shift. In the case where couplers are used for the divider circuit 15 and the combiner circuit 19 that provide an inherent 90 degree phase shift (or have embedded 90 degree phase shifters that generate the phase shift between the paths), there is no need for an additional phase shifter. If the divider 15 is a 90 degree hybrid coupler and the combiner 19 is a Wilkinson signal combiner, for example, then a 90 degree phase shifter may be added to one of the paths 16, 19 to obtain the desired phase relationship between the two paths. Other arrangements are also possible.

In at least one embodiment, the bias circuit 24 includes circuitry for adjusting a bias voltage level applied to the transistor amplifier 22 and circuitry for adjusting an attenuation level of at least one of the first and second attenuators 21, 28 placed before and after the amplifier 22. In one embodiment, the circuitry for adjusting the attenuation level comprises circuitry for adjusting the attenuation level in conjunction with a change in bias voltage applied to the amplifier 22.

In one embodiment, at least one of the first and second attenuators 21, 28 are provided as electronically tunable attenuators controllable in conjunction with a change in a voltage level of a bias voltage applied to the amplifier 22. In one embodiment, linearizer circuit 12 includes circuitry to electronically adjust a phase shift of at least one of the first and second RF signal paths 16, 18.

In one embodiment, the linearizer circuit 12 further includes circuitry for electronically adjusting an attenuation level of either or both of the first and second RF signal paths 16, 18 and circuitry for electronically adjusting a phase shift of either or both of the first and second RF signal paths. For example, in some embodiments processor 34 may serve to electronically adjust attenuation levels and phases of either or both of RF signal paths 16, 18.

In one embodiment, processor 34 calculates an optimum condition from an RF signal at the linearizer output and provides one or more control signals to circuitry for electronically adjusting an attenuation level of either or both of the first and second RF signal paths 16, 18. Processor 34 may also provide one or more control signals to circuitry for electronically adjusting a phase shift of either or both of the first and second RF signal paths 16, 18. In one embodiment, processor 34 is configured to generate signals reflective of one or more environmental conditions (e.g., weather, temperature, humidity, etc.) and to use the signals to calculate the optimum condition.

As mentioned above in conjunction with FIG. 1, in one embodiment, processor 34 provides one or more control signals to the amplification path 18. The control signal(s) set the conditions needed in signal path 18 to reduce (or in an ideal case eliminate) sideband signals 33 from the RF output signal $RF_{OUT}$, in at least one implementation, processor 34 may provide control signals to the circuitry for electronically adjusting an attenuation level of either or both of the first and second RF signal paths and also provide the control signal(s) to the circuitry for electronically adjusting a phase shift of either or both of the first and second RF signal paths to reduce sideband signals 33.

Figure 2A:
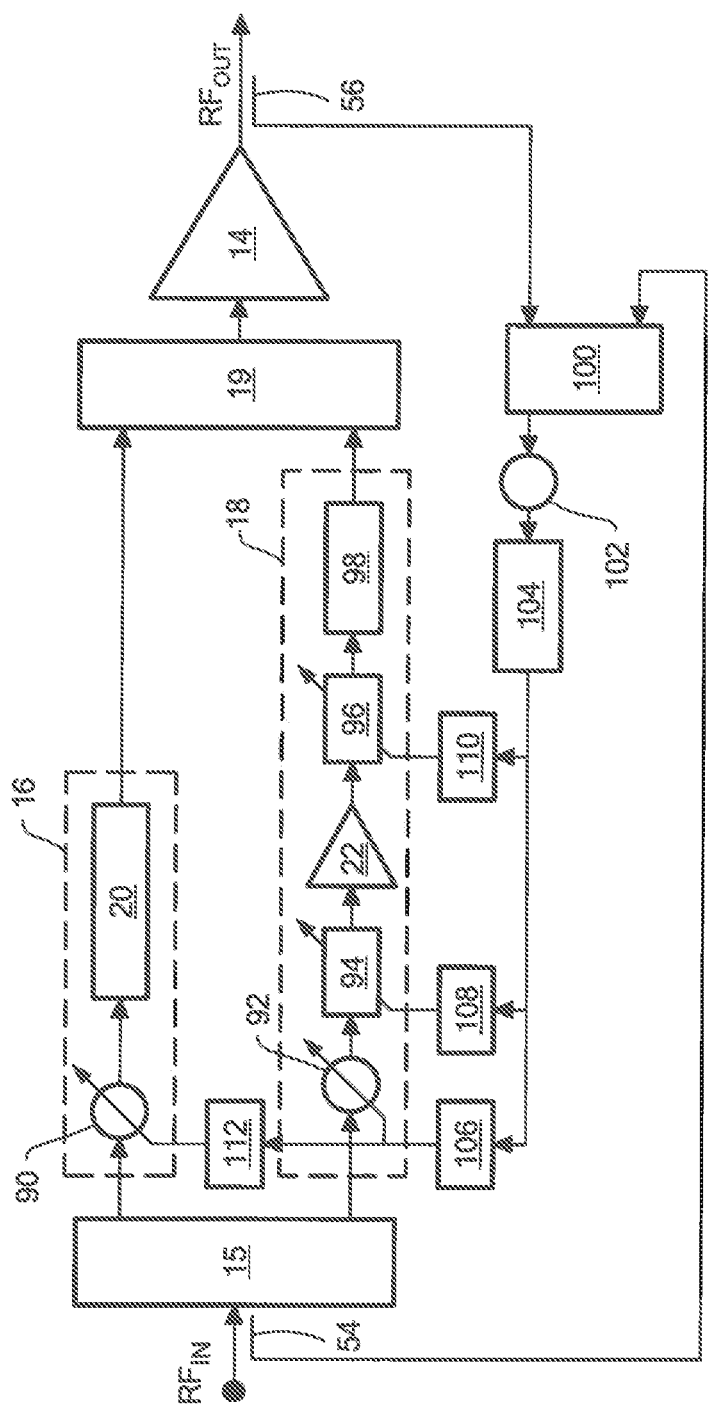
FIG. 2A is a block diagram of still another exemplary linearized RF amplifying device in accordance with an embodiment.

Referring now to FIG. 2A, non-amplification signal path 16 includes a phase adjuster 90 and a delay line 20 implemented as a transmission line. As discussed in conjunction with FIG. 2, it should be appreciated that the purpose of the delay line 20 is to equalize the delay in non-amplification signal path 16 with the delay in amplification signal path 18.

Amplification signal path 18 may include a transistor amplifier 22 that includes an odd number of transistor stages, a phase adjuster 92, a first attenuator 94 disposed prior to transistor amplifier 22 and a second attenuator 96 disposed after transistor amplifier 22. One or more delay lines 98 (illustrated in FIG. 2A as a transmission one) may also be located within amplification signal path 18 (e.g., coupled to an output of second attenuator 96 and/or elsewhere.

The transistor amplifier may also have a bias circuit thereto (not shown in FIG. 2A).

As shown in FIG. 2A, portions of an RF input signal and an RF output signal are coupled (using input coupler 54 and output coupler 56) to a cancellation circuit 100 which cancels like components of the signals provided thereto. In particular, the cancellation circuit 100 subtracts the RF input signal portion provided thereto from the RF output signal portion provided thereto. If the RF input signal is relatively clean, this process results in the cancellation circuit 100 providing a cancellation signal comprised substantially only of the sidebands of the RF output signal, which result from nonlinearities in the power amplifier.

It may be desirable to measure the amplitude and/or phase of the sideband signal of the RF output signal and thus the cancellation circuit 100 may provide a cancellation signal to a detector 102. The detector 102 may detect an amplitude and/or phase of the cancellation signal provided thereto and generate a detector signal which can be used to adjust attenuators and/or phase shifters in both the amplification and non amplification signal paths 16, 18 of the linearizer to reduce (or in some cases, eliminate) the sidebands in the RF output signal which give rise to the cancellation signal.

The detector 102 may provide the detector signal to a processor 104 which may be the same as or similar to processor 34 discussed above in connection with FIG. 2. The processor 104 receives the detector signals provided thereto and generates control signals. The control signals are coupled through respective ones of interface circuit 106, 108, 110, 112 to some or all of the phase shifters and attenuators in one or both of the non-amplification and amplification signal paths 16, 18 of the linearizer. The interface circuits 106, 108, 110, 112 receive signals from the processor 104 (e.g., TTL signals, a stream of digital bits, etc.) and convert the signals into a form appropriate to control the phase adjustors and attenuators so as to reduce (or in some cases, eliminate) sideband signals of the RF output signal. Although not illustrated, control signals May also be generated to control one or more bias levels applied to transistor amplifier 22.

In at least one embodiment, attributes of one or both of the amplification and non-amplification signal paths 16, 18 may be adjusted during operation so that maximum cancellation is achieved in the combiner 19 when smaller input signals are applied to the linearizer (e.g., under small signal conditions). Phase adjustments may be made to one or both of the RF signal paths 16, 18 so that the phases at the output of the paths 16, 18 are appropriate to produce cancellation in combiner 19 (e.g., 180 degree phase difference for a conventional in-phase combiner, etc.). Amplitude adjustments may also be made to one or both of the RF signal paths 16, 18 so that amplitude levels at the output of the paths 16, 18 are appropriate to produce cancellation (e.g., substantially equal amplitude levels for small signal input). In some implementations, phase delay adjustments are made in the non-amplification (i.e., passive) path and amplitude adjustments are made in the amplification path (by, for example, adjusting a bias voltage level on amplifier 22, adjusting variable attenuators 44, 44, and/or other ways). In other embodiments, phase and amplitude adjustments may be made in other ways. As the input power of the linearizer increases, the amount of signal cancellation that occurs in combiner 19 may decrease.

Figure 3:
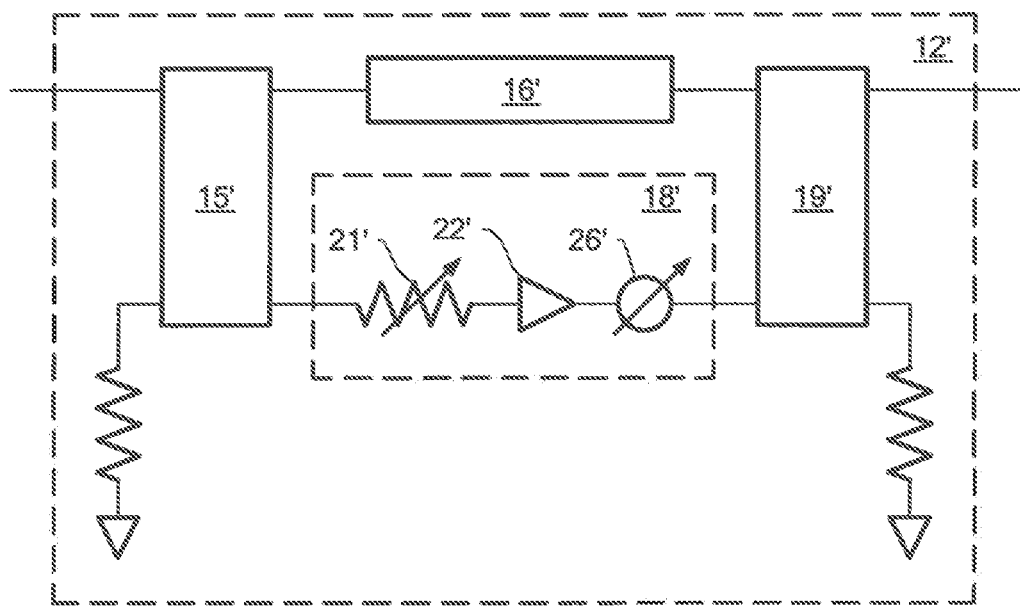
FIG. 3 is a block diagram of an exemplary linearization circuit in accordance with an embodiment.

Referring now to FIG. 3, a linearizer circuit 12' includes a divider circuit 15' which creates a nominal 90 degrees of phase shift between two RF output signals thereof and a combiner circuit 19' that receives two substantially opposite phase RF signals with an additional nominal 90 degrees of phase shift and combines them while cancelling the 90 degrees of phase shift. A nonamplification signal path 16' includes a delay line having a predetermined delay valve. An amplification signal path 18' includes a variable attention 21', an amplifier 22' having an odd number of transistor amplifier stages, and a variable phase shifter 28'. A fourth port of both divider 15' and combiner 19' may be terminated in a resistive termination.

It should be appreciated that linearizer circuit 12' may be used in the amplifying device 10 described above in conjunction with FIGS. 1 and 2.

Figure 4:
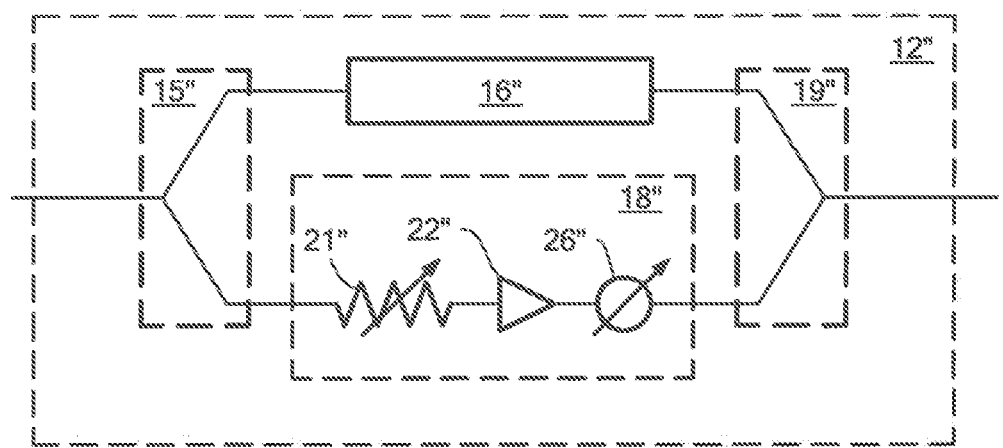
FIG. 4 is a block diagram of another exemplary linearization circuit in accordance with an embodiment.

Referring now to FIG. 4, a linearizer circuit 12" includes a divider circuit 15" provided as a zero-degree coupler (e.g., a Wilkinson power divider, etc.) and a combiner circuit 19" provided as a zero-degree combiner circuit (e.g., a Wilkinson combiner, etc.).

It should be appreciated that linearizer circuit 12' may be used in the amplifying device 10 described above in conjunction with FIGS. 1 and 2.

In some embodiments, the phase delay structure used in the non-amplification signal path 16 may be provided as a microstrip structure. In some other embodiments, co-planar waveguide (CPW) may be used. Other transmission structures may alternatively be used. In some embodiments, CPW may be used for both the non-amplification signal path 16 and the amplification path 18.

In the description above, various examples of the first and second RF signal paths 16, 18 are disclosed, with each describing different component combinations within the paths 16, 18. It should be appreciated that a wide variety of different combinations of delay lines, transmission lines, phase adjusters, variable attenuators, and/or other components may be used within the first and second RF signal paths 16, 18 in other embodiments. Both the number and the location of each different component may change from implementation to implementation.

Figure 5:
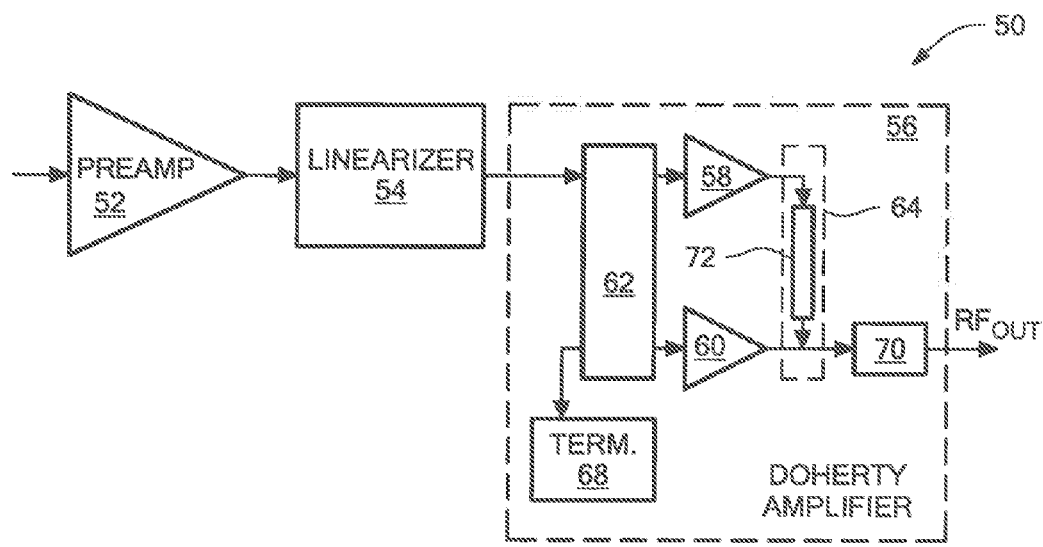
FIG. 5 is a block diagram illustrating an exemplary power amplification system that uses a Doherty power amplifier in accordance with an embodiment.

FIG. 5 is a block diagram illustrating an example power amplification system 50 that uses a Doherty power amplifier in accordance with an embodiment. As illustrated, power amplification system 50 may include: a preamplifier 52, a linearizer circuit 54, and a Doherty power amplifier 56. Doherty power amplifier 56 is operative for amplifying an RF input signal to generate an amplified RF signal at an output thereof. Linearizer circuit 54 is operative for processing or shaping, the input signal before it reaches the Doherty amplifier 56 in a manner that is intended to improve overall system linearity. In various embodiments, linearizer circuit 54 may present a relatively large loss before the Doherty amplifier 56. Preamplifier 52 may be provided to amplify the input signal before it reaches linearizer circuit 54 to, for example, compensate for losses within the linearizer 54. In some implementations, preamplifier 52 may be located between linearizer circuit 54 and Doherty amplifier 56. In some other implementations, a preamplifier is not used.

As shown in FIG. 5, in some embodiments, Doherty amplifier 66 may include a carrier amplifier 58, a peaking amplifier 60, an input divider 62, an output combiner 64, and an impedance transformer 70. Divider 62 is operative for splitting an input signal into first and second signal components. The first signal component is delivered to the input of carrier amplifier 58 and the second signal component is delivered to the input of peaking amplifier 60. Combiner 64 combines the output signals of carrier amplifier 58 and peaking amplifier 60 to generate a single amplified output signal. Impedance transformer 70 may be used to match an output impedance of Doherty amplifier 56 to the input impedance of a driven device (e.g., an antenna, etc.).

During operation of Doherty amplifier 56, both carrier amplifier 58 and peaking amplifier 60 will be operative during periods of high input signal level (i.e., peak periods) and both will contribute to RF signal amplification. During periods of lower input signal level, on the other hand, peaking amplifier 60 will be pinched off and will not contribute to RF signal amplification. Because peaking amplifier 60 is pinched off during this time, it consumes little to no DC power.

In general, carrier amplifier 58 may be configured as a class B or class RB amplifier and peaking amplifier 60 may be configured as a class C amplifier. Carrier amplifier 58 and peaking amplifier 60 may each be single stage or multi-stage amplifiers. In at least one implementation, both carrier amplifier 58 and peaking amplifier 60 are two stage amplifiers using a one device driving four device architecture. Any type of power transistors may be used within carrier amplifier 58 and peaking amplifier 60 including, for example, bipolar junction transistors (BJTS), field effect transistors (FETs), metal oxide semiconductor FETs (MOSFETs), laterally diffused MOS-FETs (LDMOS), metal semiconductor FETs (MESFETs), heterojunction bipolar transistors (HBTs), high voltage HBTs (HV-HBTs), heterostructure FETs (HFETs), high electron mobility transistors (HEMTs), pseudomorphic HEMTS (pHEMTs), metamorphic HEMTS (mHEMTs), and/or others. In addition, transistors using any of a variety of different materials may be used including, for example, silicon, silicon carbide, gallium arsenide, gallium nitride, indium gallium arsenide, aluminum gallium arsenide, and/or others.

Divider 62 may include any type of device that is capable of splitting an RF signal. In at least one embodiment, a divider 62 is used that splits the input signal into two signal components having substantially equal signal amplitudes. However, dividers having unequal output levels may be used in some implementations. In the illustrated embodiment, divider 62 comprises a 90 degree hybrid coupler that generates two equal amplitude (or approximately equal amplitude) output signals that are 90 degrees out of phase. Because the 90 degree hybrid is a four port device, a termination 68 may be provided to terminate the fourth port of the device. Other types of divider circuits may be used in other implementations including, for example, hybrids having other phase shift values, Wilkinson dividers, and/or others.

In the illustrated embodiment, combiner 64 includes a quarter wavelength transmission line section 72 that acts as an impedance inverter at the output of carrier amplifier 58 to combine the output signals of carrier amplifier 58 and peaking amplifier 60. Other types of combiners may be used in other implementations including, for example, hybrid combiners, Wilkinson combiners, and/or others. Although not shown, in some implementations, one or more phase shifters may be provided within Doherty amplifier 56 to ensure that the signals are properly phased for combining. It should be appreciated that Doherty amplifiers may be implemented using any of a number of different architectures and the architecture shown in FIG. 5 is just an example of one architecture that may be used in an embodiment. The techniques described herein may be used with Doherty amplifiers having any architecture.

As described above, linearizer circuit 54 is operative for processing or shaping the input signal of Doherty amplifier 56 in a manner that is intended to improve overall linearity. This may be accomplished by, for example, increasing the relative magnitude of some portions of the input signal while decreasing the relative magnitude of other portions of the input signal in a manner that complements the operation of Doherty amplifier 56. For example, Doherty amplifier 66 will typically have higher gain for lower power (i.e., small signal) input signals and lower gain for higher power input signals (due to, for example, gain compression and saturation). Thus, linearizer circuit 54 may be configured to increase the relative magnitude of higher power portions of the input signal while decreasing the relative magnitude of lower power portions of the input signal. The term "relative magnitude" is being used here to indicate the magnitude with respect to other portions of the input signal.

In some implementations, linearizer circuit 54 may comprise a linearizer that is substantially the same as or similar to the ones described above (e.g., in FIGS. 1, 2, 2A, 3, and 4 and the associated description). For example, linearizer circuit 64 may include first and second RF signal paths, a divider circuit to split an input signal into first and second components to feed the first and second RF signal paths, and a combiner circuit to combine the outputs of the first and second RF signal paths. As described previously, in some implementations, the first RF signal path may be a passive signal path that does not include any amplifiers and the second RF signal path may include an odd number of transistor amplifiers to amplify signals propagating through the path. In at least one implementation, the first RF signal path may include a transmission line section having a specific length.

The first and second RF signal paths may be configured in a manner that maintains a 180 degree phase difference between the two paths within a frequency range of interest. In this manner, the output signals of the two paths will subtract within the output combiner. As described previously, a transistor amplifier will typically maintain a relatively constant 180 degree phase shift between an input signal and an output signal across frequency. Therefore, by using an odd number of transistors amplifiers, the desired phase difference between the first and second paths is relatively easy to maintain. It should be appreciated, however, that in some implementations other techniques for maintaining the desired phase difference between the paths may be used.

In some embodiments, additional phase adjustment circuitry (e.g., adjustable phase shifters, etc.) may be provided within the first and/or second RF signal paths to make adjustments in the relative phase of the paths. Similarly, in some embodiments, additional amplitude adjustment circuitry (e.g., variable attenuators, etc.) may be provided within the first and/or second RF signal paths to provide signal amplitude adjustment at desired locations therein (e.g., at the input of an amplifier in the second path, at an output of one or both of the paths, etc.). These adjustable elements may be used to tune or calibrate the first and/or second RF paths to achieve an optimal or near optimal level of linearization for Doherty amplifier 56.

As is well known, a transistor amplifier typically provides higher gain under small signal input conditions. As the magnitude of the input signal increases, the gain of the transistor amplifier will compress and the amplifier will eventually enter saturation, in at least one implementation, linearizer circuit 54 is configured so that the gain of the second RF signal path (the amplified path) is similar to or the same as the gain of the first RF signal path (the non-amplified path) during small signal input conditions (i.e., during low power portions of the input signal). For this reason, a maximum amount of signal cancellation may be achieved in the combiner circuit of the linearizer during small signal conditions. During higher power portions of the input signal, the gain of the second RF signal path will be less than the gain of the first RF signal path, resulting in less signal cancellation in the combiner circuit. In this manner, the relative amplitudes of the lower power portions of the input signal are reduced and the relative amplitudes of the higher power portions of the input signal are increased in the linearizer 54. The linearizer circuit 54 may be configured so that the gain versus input power curve of the linearizer 54 complements the gain versus input power curve of the Doherty amplifier 56 in a manner that linearizes overall amplifier operation. Using this technique, a power amplification system may be achieved that has a relatively linear response characteristic over a relatively wide range of input power levels and a relatively wide RF bandwidth.

In some implementations, linearizer circuit 54 may add a significant amount of loss before the input port of Doherty amplifier 56. As described above, in some embodiments, preamplifier 52 may be provided to boost the input signal before it reaches Doherty amplifier 56 to compensate for the loss of the linearizer 54. When used, preamplifier 52 may be provided before or after linearizer circuit 54, in some implementations, preamplifier 52 may comprise a relatively linear small signal amplifier so that the overall linearity of power amplification system 50 is not degraded. In at least one implementation, a class A amplifier may be used as preamplifier 52, although other types of amplifiers having relatively linear responses may be used in other embodiments. In some other implementations, linearizer circuit 64 may be configured to linearize the combination of preamplifier 52 and Doherty amplifier 56. In at least one embodiment, the gain of preamplifier 52 is set so that the combined gain of preamplifier 52 and linearizer circuit 54 is zero dB or greater across an input power range of interest and a frequency range of interest.

Figure 6:
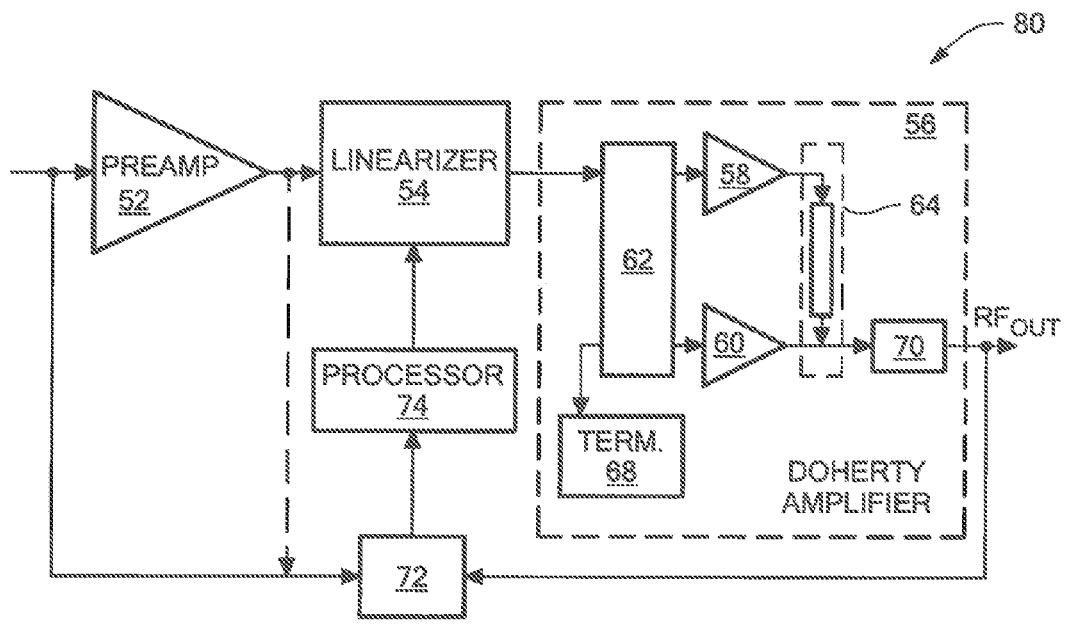
FIG. 6 is a block diagram illustrating an exemplary power amplification system that is able to adapt to changing nonlinear characteristics of a Doherty amplifier in accordance with an embodiment.

In some implementations, power amplification system 50 of FIG. 5 may be calibrated once during manufacture or before deployment to provide linear operation over a frequency range and input power range of interest. However, if the nonlinear characteristics of Doherty power amplifier 66 change for some reason after the initial tuning, linearizer circuit 54 may not operate as well as it could. Such changes might occur due to, for example, memory effects within Doherty amplifier 56. FIG. 6 is a block diagram illustrating a power amplification system 80 that uses feedback to adapt to changing nonlinear characteristics of Doherty amplifier 56 in accordance with an embodiment. As illustrated in FIG. 6, power amplification system 80 may include substantially the same elements as system 50 of FIG. 5 with the addition of a difference unit 72 and a processor 74. The difference unit 72 receives coupled portions of an input signal and an output signal of power amplification system 60 and processes the coupled signals in a manner that isolates and quantifies a non-linear content of the output signal (i.e., content that results from non-linearities in power amplification system 80). The non-linear content information may then be delivered to digital processor 74 which can use the information to adjust one or more adjustable elements within linearizer circuit 54 to tune the linearizer based on changing nonlinear characteristics of Doherty amplifier 56.

In at least one implementation, difference unit 72 may subtract the input signal of power amplification system 80 from the output signal to isolate sidebands of the output signal that are indicative of nonlinear operation. The input signal may be coupled from the input of preamplifier 52 (when used) or the input of linearizer 64. The sideband information may then be delivered to digital processor 74 for use in modifying control signals delivered to elements within linearizer circuit 64. As will be appreciated, one or more devices or components may be provided within difference unit 72 (or elsewhere) to ensure that the amplitudes of the coupled input and output signals are of a comparable size before subtraction. This may include, for example, an adjustable attenuator, an automatic gain control (AGC) unit, or some other structure.

In at least one embodiment, processor 74 may include a digital processor and difference unit 72 may be replaced by a pair of analog to digital converters (DACs) that digitize the coupled input and output signals and deliver the resulting digital signals directly to digital processor 74. Processor 74 may then process the digital signals to develop the control signals for the linearizer circuit 54. In at least one approach, processor 74 may normalize the received signals and then perform a difference operation to isolate the sidebands of the output signal or some other indication of nonlinear behavior in the Doherty amplifier.

As described previously, in some embodiments, phase adjustment circuitry and/or amplitude adjustment circuitry may be provided within the first and/or second RF signal paths of linearizer circuit 54 for use in tuning the linearizer. In some implementations, this circuitry may be digitally controllable and processor 74 may adjust these elements in response to a changing non-linear characteristic of Doherty amplifier 56. In addition, or alternatively, processor 74 may adjust bias or power supply levels applied to one or more amplifiers within the second RF signal path of linearizer circuit 54 to adapt to changing nonlinear characteristics in the Doherty amplifier 56.

In some implementations, digital processor 74 may be configured to identify a change in the nonlinear content of the output signal of Doherty amplifier 56 before any changes are made to settings within linearizer circuit 54. In some other implementations, processor 74 may be configured to modify settings within linearizer circuit 54 in response to the non-linear content of the output signal exceeding a threshold level (e.g., a magnitude level of the sidebands, a total energy level of the sidebands, etc.). In some other implementations, adjustments may be made to the settings in linearizer circuit 54 in a periodic or continual manner regardless of a current sideband content of the output signal.

Figure 7:
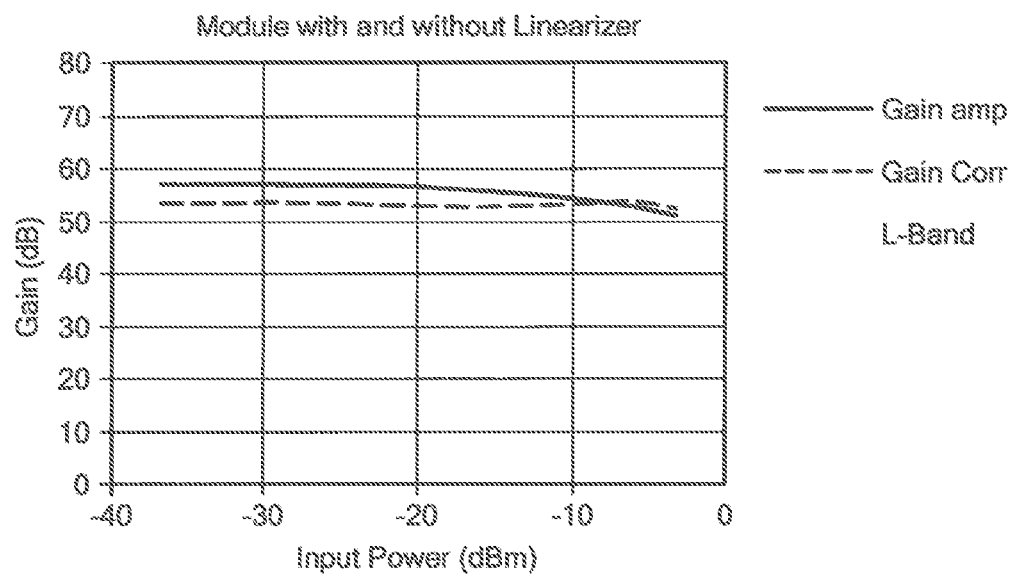
FIGS. 7-11 are graphs illustrating measured performance data for an implementation of a power amplification system operating at 12 GHz.
Figure 8:
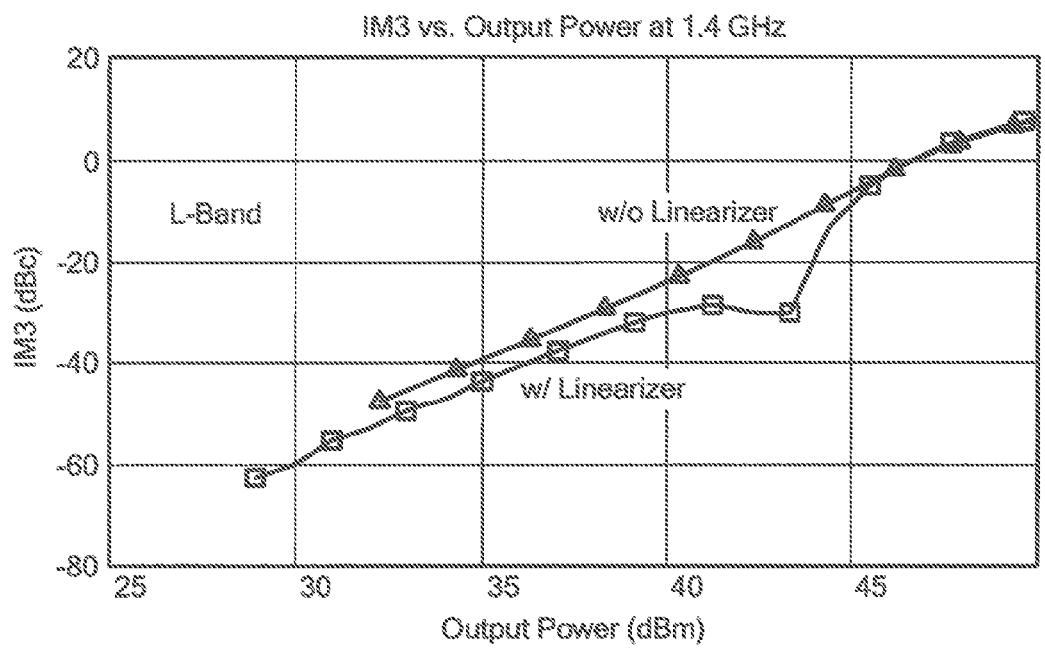
Figure 9:
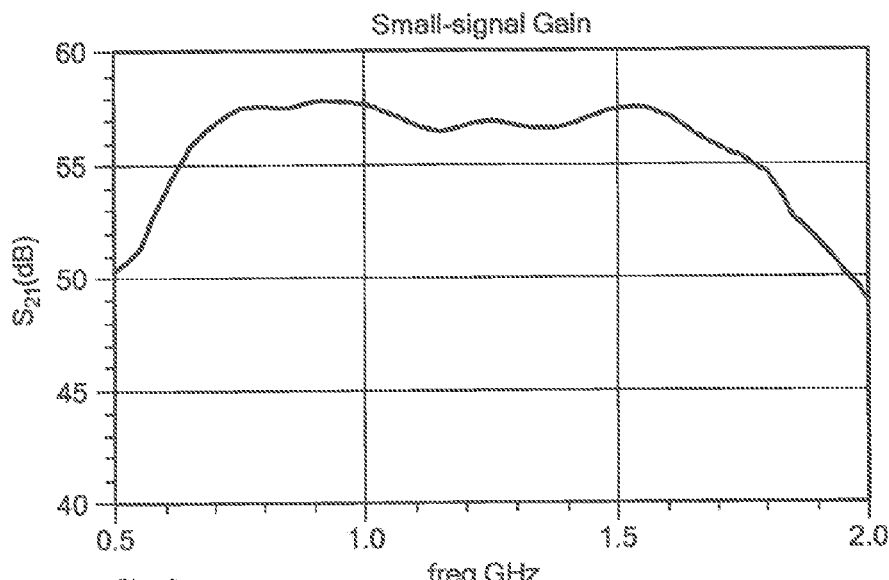
Figure 10:
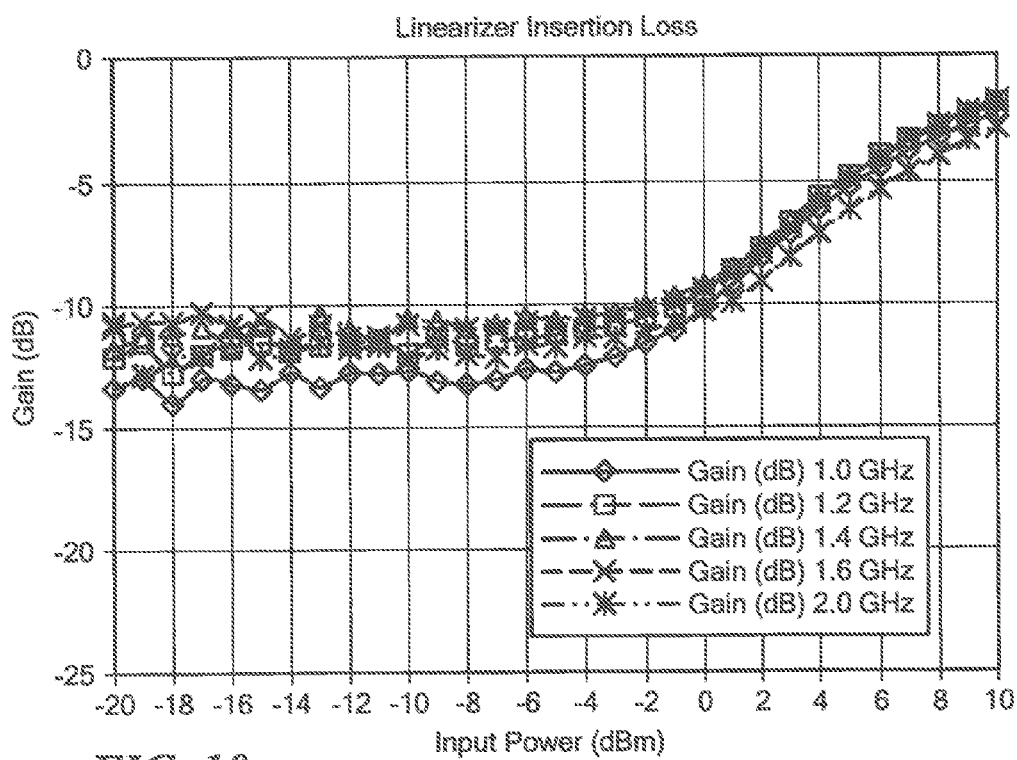
Figures 11, 12:
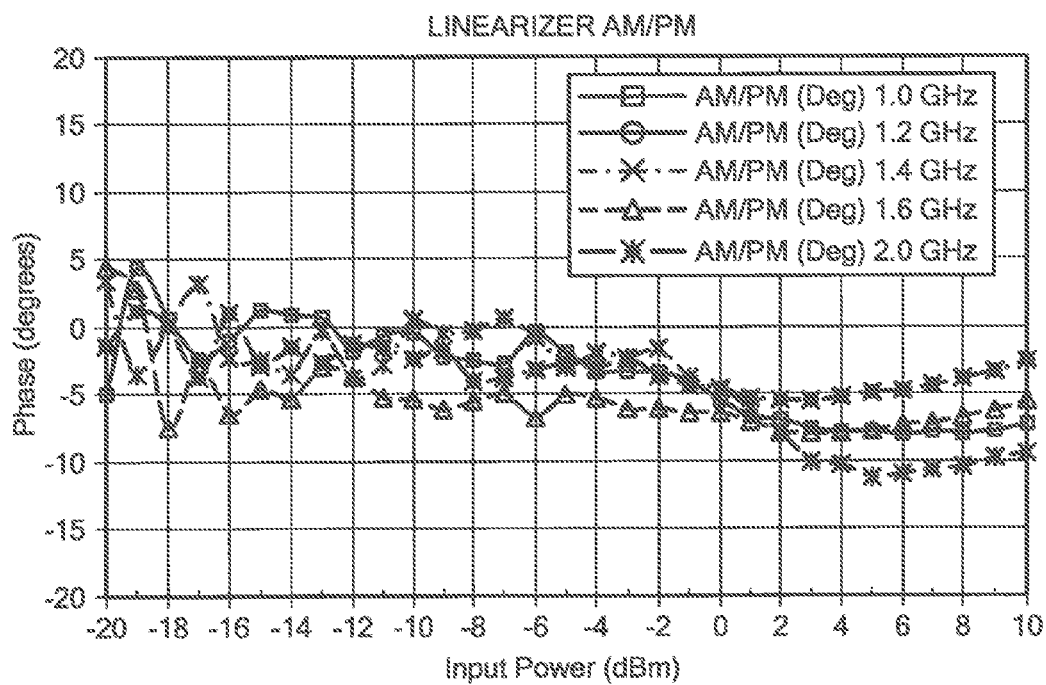
FIG. 12 is a table displaying the results of a simulation for a K-band power amplification system having a Doherty amplifier, both with and without a linearizer, for QPSK and 64-QAM signals.

FIGS. 7-11 are graphs illustrating measured performance data for an example implementation of a power amplification system operating at 12 GHz (L-band). The L-band power amplification system has an architecture similar to system 50 of FIG. 5. FIG. 7 shows gain versus input power for the L-band power amplification system with (Gain Amp) and without (Gain Corr) the linearizer circuit. FIG. 8 shows the third order inter-modulation product (IM3) versus output power for the L-band power amplification system when a two tone drive signal is used, with and without the linearizer circuit. FIG. 9 shows the small signal gain of the L-band power amplification system versus frequency. FIG. 10 shows the insertion loss versus input power for the linearizer circuit of the L-band power amplification system for various L-band frequencies. FIG. 11 shows the AM/PM distortion versus input power for the linearizer circuit of the L-band power amplification system for various L-band frequencies.

When used at high data rates, signal modulation schemes having a high peak to average power ratio (PAPR) typically make it difficult to provide linear power amplification in an efficient manner. Some signal modulation schemes having a high PAPR include, for example, quadrature phase shift keying (QPSK), 64 quadrature amplitude modulation (64-QAM), 128-QAM, orthogonal frequency division multiplexing (OFDM), and/or others. In various implementations, the power amplification systems described herein are capable of providing a high level of linearity in a very efficient manner when being used with high PAPR modulation schemes. In particular, power amplification systems that use a linearizer circuit feeding a Doherty power amplifier (such as, for example, power amplification systems 50, 80 of FIGS. 5 and 6) are capable of providing highly efficient operation when used with high PAPR modulation schemes.

FIG. 12 is a table displaying the results of a simulation that was performed to predict the performance of a power amplification system at band (i.e., 20 GHz) having a Doherty amplifier, both with and without a linearizer, for QPSK and 64-QAM signals. As shown, for both modulation schemes, significant improvements can be achieved in output power and power added efficiency (PAE) when a linearizer circuit is used with a Doherty amplifier. For QPSK, the efficiency of the power amplification system is projected at close to 40% for the average output power when a linearizer is used. The increase in output power and PAE is realized because the power amplification system can be driven to much higher power levels while still maintaining the specified linearity (e.g., ACPR=−40 dBc). The insertion loss of the linearizer circuit in the simulation is about 6 dB at 20 GHz, which can be easily compensated with an additional gain stage at the input of the linearizer with only a small impact on efficiency.

Figure 13:
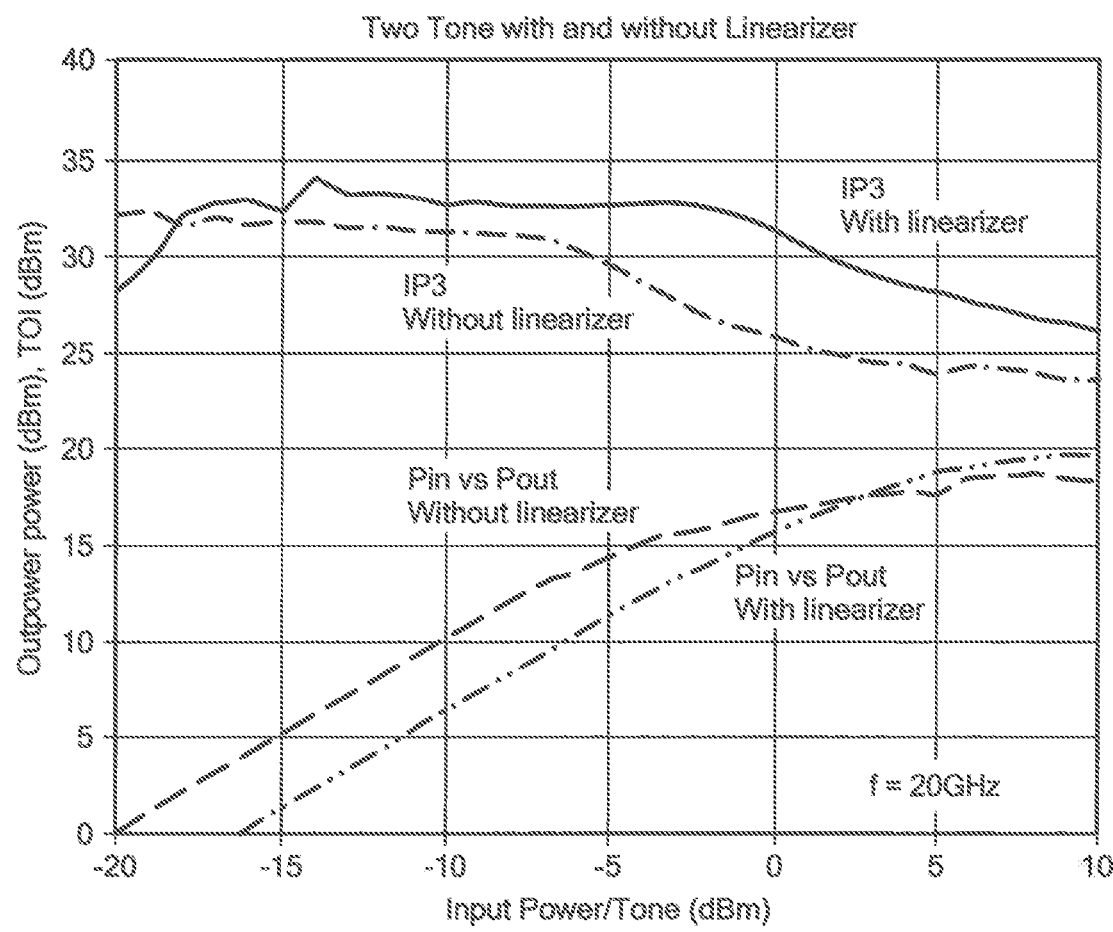
FIG. 13-19 are graphs illustrating simulated performance data for a K-band power amplification system having a Doherty amplifier, both with and without a linearizer, for QPSK and 64-QAM signals.
Figure 14:
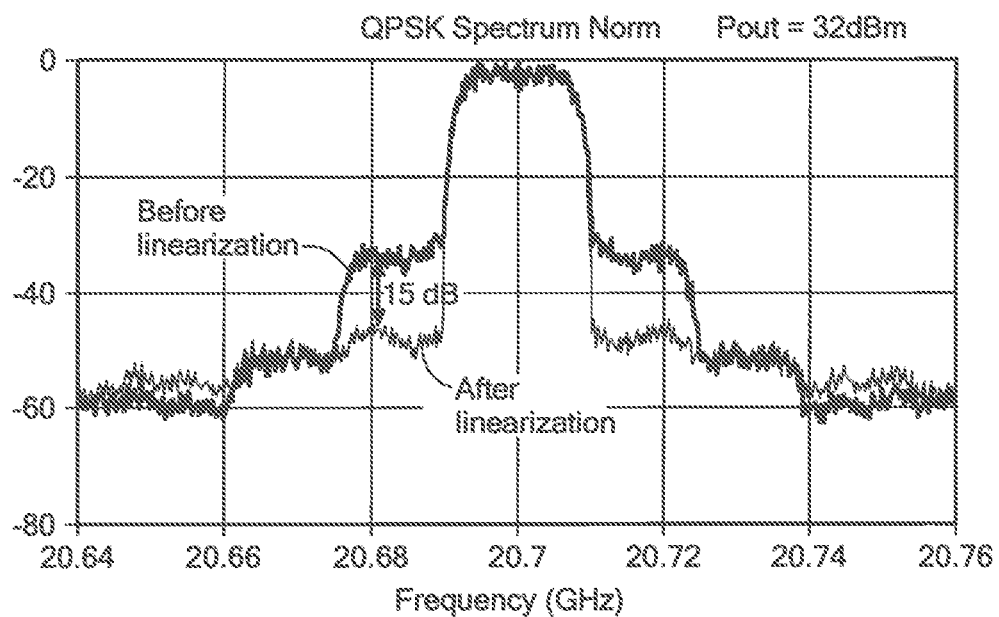
Figure 15:
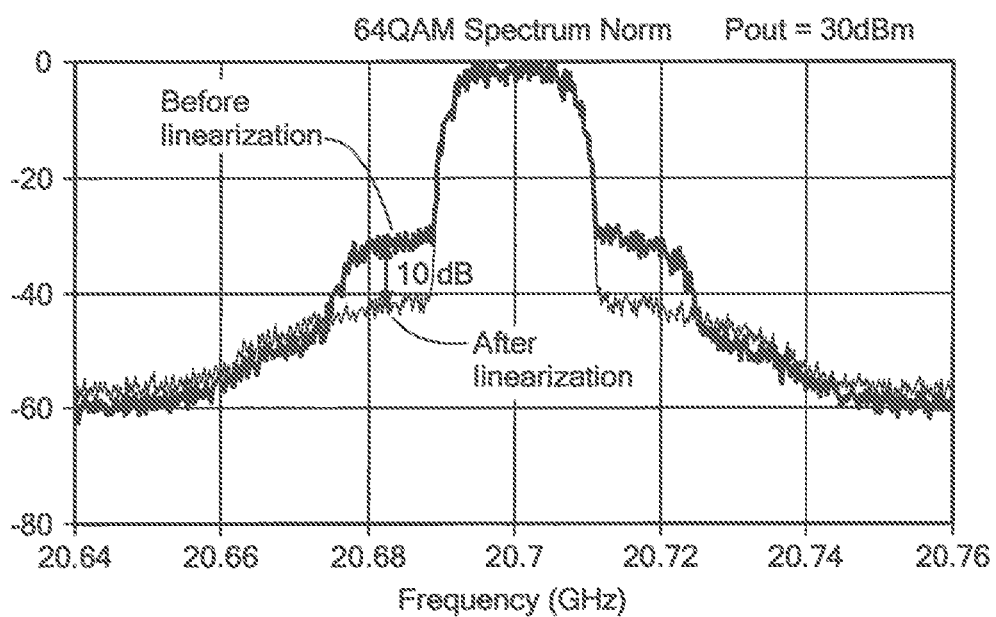
Figure 16:
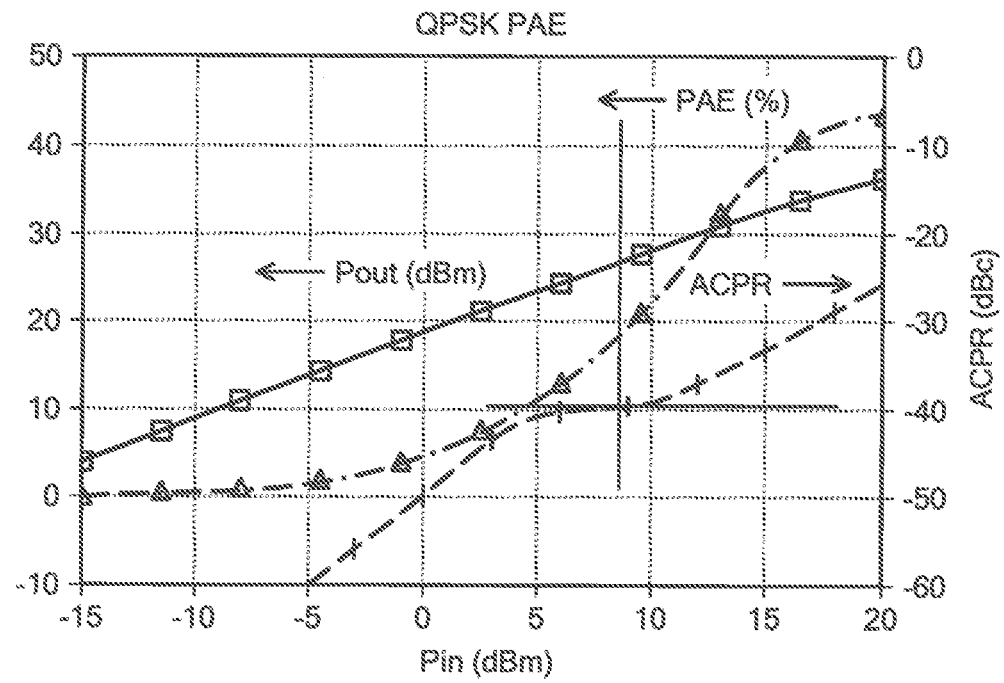
Figure 17:
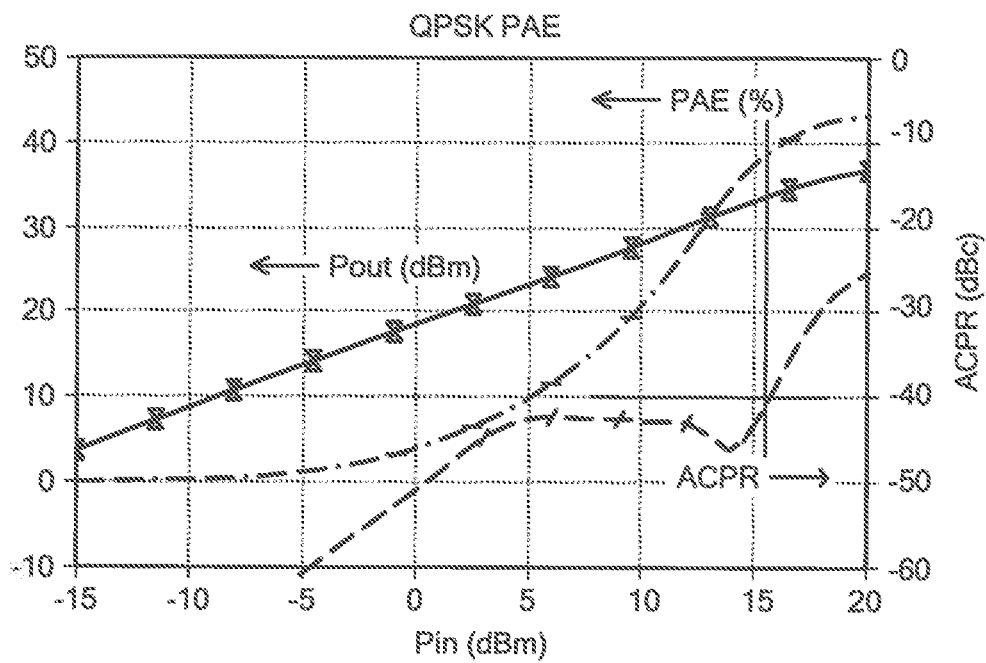
Figure 18:
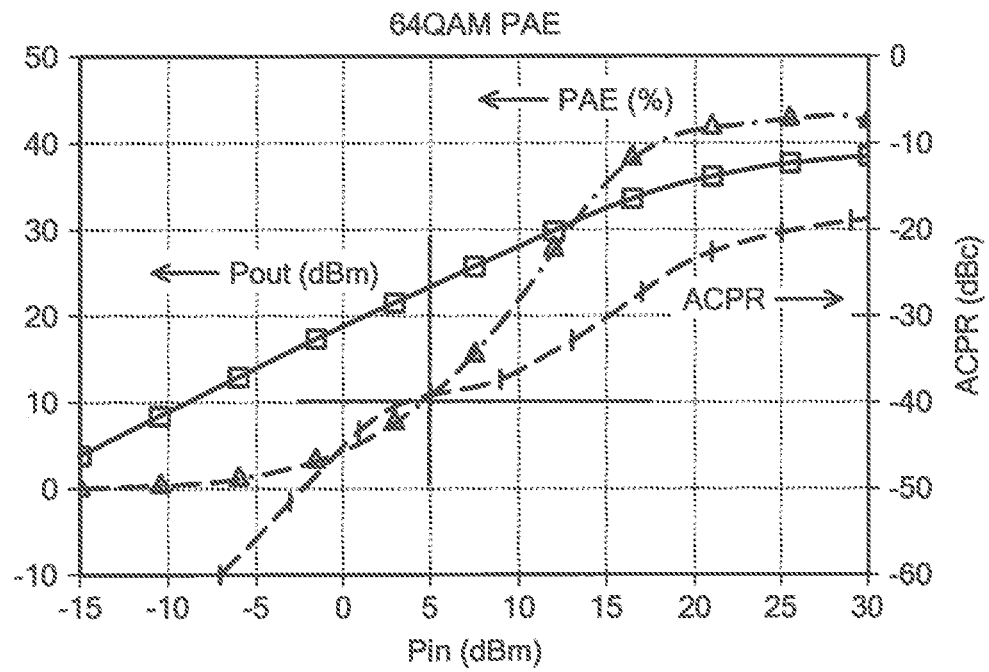
Figure 19:
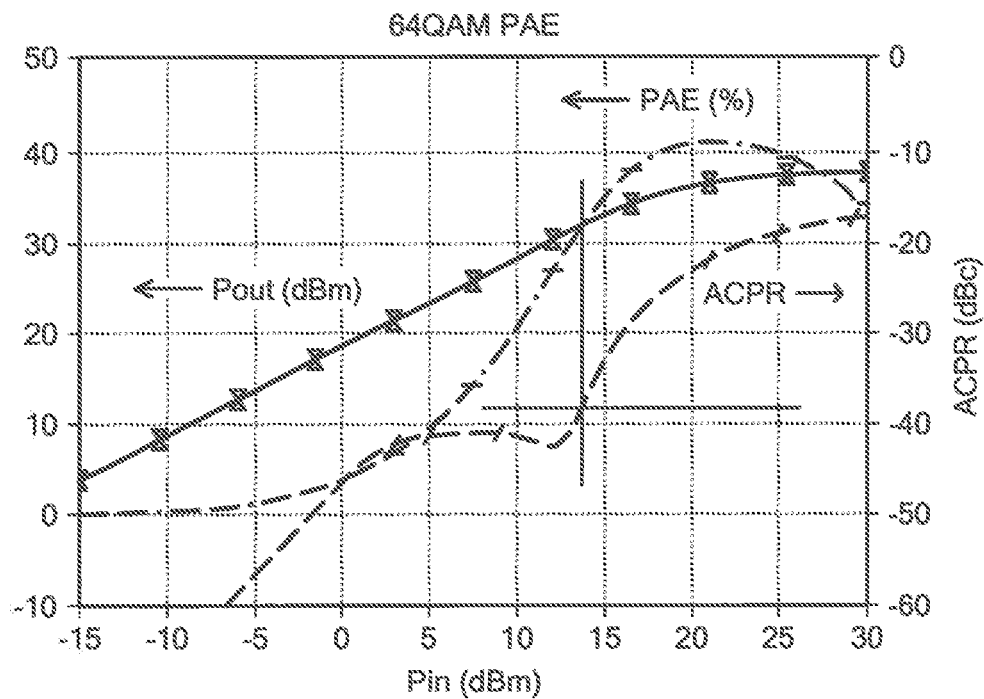

FIGS. 13-19 are graphs illustrating simulated performance data for the K-band power amplification system described above, both with and without a linearizer, for QPSK and 64-QAM signals. FIG. 13 shows output power versus input power for the K-band system (at 20 GHZ), with and without the linearizer. FIG. 13 also shows the third order inter-modulation product magnitude versus input power with and without the linearizer. FIG. 14 show, the output spectrum of the K-band power amplification system, with and without the linearizer, when CPSK signals are used. As shown, use of the linearizer is able to reduce the sideband levels by about 15 dB. FIG. 15 shows the output spectrum of the K-band power amplification system, with and without the linearizer, when 84-QAM signals are used. In this case, the linearizer is able to reduce the sideband levels by about 10 dB. FIGS. 10 and 17 show output power versus input power, PAE versus input power, and adjacent channel power ratio (ACPR) versus input power for the K-band power amplification system when QPSK signals are being used. FIG. 16 shows the simulation results when a linearizer is not used and FIG. 17 shows the simulation results when a linearizer is used. FIGS. 18 and 19 show output power versus input power. PAE versus input power, and adjacent channel power ratio (ACPR) versus input power for the K-band power amplification system when 64-QAM signals are being used. FIG. 18 shows the simulation results when a linearizer is not used and FIG. 19 shows the simulation results when a linearizer is used.

In some implementations, the various circuits and systems described herein are implemented as monolithic microwave integrated circuits (MMICS). However, implementations using discrete circuit elements and implementations that are partially integrated and partially discrete may also be used.

In various embodiments described herein, processors and/or signal processing units may be used in connection with a linearizer circuit to adjust operational parameters of the linearizer circuit based on, for example, the output signal of an RF amplifier. In some implementations, these processors may include digital processing devices such as, for example, a general purpose microprocessor, a digital signal processor (DSP), a reduced instruction set computer (RISC), a complex instruction set computer (CISC), an application specific integrated circuit (ASIC), a field programmable gate array (FPGA), a programmable logic array (PLA), a microcontroller, an embedded controller, and/or others, including combinations of the above. In various embodiments, techniques and systems described herein may be implemented using any combination of hardware, software, and firmware.

Having described preferred embodiments which serve to illustrate various concepts, circuits, and techniques which are the subject of this patent, it will now become apparent to those of ordinary skill in the art that other embodiments incorporating these concepts, circuits, and techniques may be used. For example, described herein is a specific exemplary circuit topology and specific circuit implementation for achieving a desired performance, it is recognized, however, that the concepts and techniques described herein may be implemented using other circuit topologies and specific circuit implementations. Accordingly, it is submitted that that scope of the patent should not be limited to the described embodiments but rather should be limited only by the spirit and scope of the following claims.

Having described preferred embodiments which serve to illustrate various concepts, circuits and techniques which are the subject of this patent, it will now become apparent to those of ordinary skill in the art that other embodiments incorporating these concepts, circuits and techniques may be used. For example, described herein is a specific exemplary circuit topology and specific circuit implementation for achieving a desired performance. It is recognized, however, that the concepts and techniques described herein may be implemented using other circuit topologies and specific circuit implementations. Accordingly, it is submitted that that scope of the patent should not be limited to the described embodiments but rather should be limited only by the spirit and scope of the following claims.

The invention claimed is:

1. A linearizer circuit comprising:
    a divider circuit having an input and first and second outputs;
    a first radio frequency (RF) signal path having an input and an output, the input being coupled to the first output of the divider circuit, the first RF signal path comprising a delay line having a predetermined length;
    a second RF signal path having an input and an output, the input being coupled to the second output of the divider circuit, the second RF signal path comprising a transistor amplifier consisting of an odd number of gain stages; and
    a combiner circuit having a first input, a second input, and an output, the first input of the combiner circuit being coupled to the output of the first RF signal path and the second input of the combiner circuit being coupled to the output of the second RF signal path;
    wherein the linearizer circuit is configured so that the output signals of the first and second RF signal paths undergo a high level of cancellation in the combiner circuit when a small signal is applied to the input of the divider circuit and a lower level of cancellation in the combiner circuit when a larger signal is applied to the input of the divider circuit.

2. The linearizer circuit of claim, 1 wherein:
    the divider circuit is configured to create a nominal 90 degree phase difference between output signals at the first and second outputs thereof; and
    the combiner circuit is adapted to receive two substantially opposite phase signals at the first and second inputs thereof with an additional nominal 90 degree phase shift and combine the signals while cancelling the 90 degree phase shift.

3. The linearizer circuit of claim, 1 wherein the second RF signal path further comprises:
    a first variable attenuator coupled between the input of the second RF signal path and an input of the transistor amplifier; and
    a second variable attenuator coupled between an output of the transistor amplifier and the output of the second RF signal path.

4. The linearizer circuit of claim 3, further comprising:
    circuitry for adjusting a bias level applied to the transistor amplifier; and circuitry for adjusting an attenuation level of at least one of the first and second variable attenuators.

5. The linearizer circuit of claim 4, wherein:
the circuitry for adjusting an attenuation level comprises circuitry for adjusting the attenuation level in conjunction with a change in bias voltage level applied to the transistor amplifier.

6. The linearizer circuit of claim 4, wherein:
the circuitry for adjusting a bias level and the circuitry for adjusting an attenuation level are configured to adjust an output amplitude of the second HF signal path so that it is substantially equal to an output amplitude of the first HF signal path when an input power level of the linearizer circuit is below a threshold value.

7. The linearizer circuit of claim 3, wherein:
at least one of the first and second variable attenuators is provided as an electronically tunable attenuator controllable in conjunction with a change in bias voltage level applied to the transistor amplifier.

8. The linearizer circuit of claim 1, wherein:
at least one of the first and second RF signal paths includes a phase adjuster.

9. The linearizer circuit of claim 8, further comprising:
circuitry to electronically adjust a phase shift of at least one of the first and second RF signal paths.

10. The linearizer circuit of claim 9, wherein:
the circuitry to electronically adjust the phase shift of at least one of the first and second RF signal paths is configured to achieve a phase difference between the output signals of the first and second RF signal paths that results in signal cancellation in the combiner circuit.

11. The linearizer circuit of claim 1, further comprising:
circuitry for electronically adjusting an output amplitude level of at least one of the first and second RF signal paths; and
circuitry for electronically adjusting a phase shift of at least one of the first and second RF signal paths.

12. The linearizer circuit of claim 11, wherein:
the output of the combiner is to be coupled to the input of an RF power amplifier during operation of the linearizer circuit; and
the linearizer circuit further comprises a signal processing unit to determine an optimum condition based on an RF output signal of the RF power amplifier and to provide at least one control signal to the circuitry for electronically adjusting an output amplitude level and the circuitry for electronically adjusting a phase shift based on the optimum condition.

13. The linearizer circuit of claim 12, wherein:
the signal processing unit is configured to receive signals indicative of environmental conditions and to use the signals indicative of environmental conditions to determine the optimum condition.

14. A method for use in linearizing operation of an RF power amplifier, comprising:
splitting a radio frequency (RF) input signal into first and second RF input signals;
providing the first RF input signal to a first RF signal path;
providing the second RF input signal to a second, different RF signal path, wherein the second RF signal path includes at least one active amplifier stage and the first RF signal path includes no active amplifier stages;
providing a first RF output signal at an output of the first RF signal path to a first input of a combiner;
providing a second RF output signal at an output of the second RF signal path to a second input of the combiner;
combining the first and second RF output signals in the combiner to generate a combined RF output signal at an output of the combiner, wherein the first and second RF signal paths and the combiner are configured so that combining the first second RF output signals results in a high level of cancellation in the combiner when the RF input signal is a small signal and a lower level of cancellation in the combiner when the RF input signal is a larger signal; and
providing the combined RF output signal to the input of an RF power amplifier.

15. The method of claim 14, wherein:
providing the second RF input signal to the second RF signal path includes providing the second RF input signal to an RF signal path that includes a transistor amplifier having an odd number of active amplifier stages.

16. The method of claim 15, wherein:
providing the second RF input signal to the second RF signal path includes providing the second RF input signal to an RF signal path that includes a first variable attenuator positioned before the transistor amplifier and a second variable attenuator positioned after the transistor amplifier.

17. The method of claim 14, further comprising:
adjusting at least one of a phase shift and an output amplitude level associated with the first and second RF signal paths in a manner that results in maximal cancellation of the first and second RF output signals in the combiner under small signal conditions.

18. The method of claim 17, wherein:
adjusting is performed under the control of a signal processing device.

19. The method of claim 14, wherein:
splitting the RF input signal into first and second RF input signals comprises splitting the RF input signal to provide first and second RF input signals with substantially 90 degrees of phase difference between them; and
combining the first and second RF output signals comprises combining the signals in a combiner that takes two substantially opposite phase signals with an additional nominal 90 degrees of phase shift and combines them while cancelling the additional nominal 90 degrees of phase shift.

20. The method of claim 14, further comprising:
determining an optimum condition based on an RF output signal of the RF power amplifier; and
electronically adjusting an attenuation level in at least one of the first RF signal path and the second RF signal path, using control signals, based, at least in part, on the optimum condition.

21. The method of claim 20, further comprising:
electronically adjusting a phase shift in at least one of the first RF signal path and the second RF signal path, using control signals, based, at least in part, on the optimum condition.

22. The method of claim 21, wherein:
the optimum condition is a condition that minimizes sideband levels in the RF output signal of the RF power amplifier.

23. An amplification system, comprising:
a linearizer circuit comprising:
a divider circuit having an input and first and second outputs;
a first radio frequency (RF) signal path having an input and an output, the input of the first RF signal path being coupled to the first output of the divider circuit, the first RF signal path having a delay line with a delay value configured to equalize delays of the first and second RF signal paths, wherein the first RF signal path is passive;

a second RF signal path having an input and an output, the input of the second RF signal path being coupled to the second output of the divider circuit, wherein the second RF signal path includes an odd number of transistor amplification stages to achieve a 180 degree phase difference between the first and second RF signal paths; and a combiner circuit coupled to the outputs of the first and second RF signal paths to combine output signals of the first and second RF signal paths to generate an output signal of the linearizer circuit, wherein the linearizer circuit is configured so that the output signals of the first and second RF signal paths undergo a high level of cancellation in the combiner circuit when a small signal is applied to the input of the divider circuit and a lower level of cancellation in the combiner circuit when a large signal is applied to the input of the divider circuit; and a power amplifier coupled to receive the output signal of the linearizer circuit;

wherein the power amplifier with the linearizer circuit operates more linearly than the power amplifier operating alone.

24. The amplification system of claim 23, wherein:
the second RF signal path includes at least one adjustable attenuator.

25. The amplification system of claim 24, wherein:
the second RF signal path includes at least one adjustable phase shifter.

26. The amplification system of claim 24, wherein:
the first RF signal path includes at least one adjustable phase shifter.

27. The amplification system of claim 23, wherein:
the gain versus input power curve of the linearizer circuit substantially complements the gain versus input power curve of the power amplifier to generate relatively linear gain for the amplification system overall.

* * * * *